(12) United States Patent
Ohkubo

(10) Patent No.: US 6,668,001 B2
(45) Date of Patent: Dec. 23, 2003

(54) SEMICONDUCTOR LASER DIODE

(75) Inventor: Michio Ohkubo, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/923,879

(22) Filed: Aug. 6, 2001

(65) Prior Publication Data

US 2002/0037021 A1 Mar. 28, 2002

(30) Foreign Application Priority Data

Aug. 9, 2000 (JP) .................................... 2000-240764
Mar. 12, 2001 (JP) .................................... 2001-068170

(51) Int. Cl.$^7$ ................................................. H01S 5/00
(52) U.S. Cl. ................................. 372/45; 372/46
(58) Field of Search ...................... 372/46, 45; 438/46

(56) References Cited

U.S. PATENT DOCUMENTS

| | | | | |
|---|---|---|---|---|
| 4,573,163 A | * | 2/1986 | Kaminow | ................... 372/45 |
| 5,809,053 A | * | 9/1998 | Nakatsuka et al. | ........... 372/45 |
| 5,825,797 A | * | 10/1998 | Nagai | ........................... 372/46 |
| 6,301,283 B1 | * | 10/2001 | Chen et al. | .................... 372/46 |
| 6,307,873 B1 | * | 10/2001 | Geels et al. | ................... 372/45 |
| 6,375,364 B1 | * | 4/2002 | Wu | ............................. 385/88 |
| 6,406,932 B2 | * | 6/2002 | Lee et al. | ..................... 438/46 |

* cited by examiner

*Primary Examiner*—Paul Ip
*Assistant Examiner*—Hung Vy
(74) *Attorney, Agent, or Firm*—Sheppard Mullin Richter & Hampton LLP

(57) ABSTRACT

A semiconductor laser diode including: a resonator structure including a first facet having a reflection film and a second facet having an antireflection film; and an active region including a linear section a uniform width extending from the first facet along a direction of the resonator and a flared section extending from the linear section toward the second facet, the flared section having a tapered width increasing toward the second facet, wherein the relation of $d < \lambda_0 / \{2 \cdot (2 \cdot n_0 \cdot \Delta n)^{0.5}\}$ holds. The semiconductor laser diode which emits in a stabled fundamental mode can be realized by satisfying the above relation for increasing the effect for suppressing the spatial hole-burning phenomenon.

22 Claims, 4 Drawing Sheets

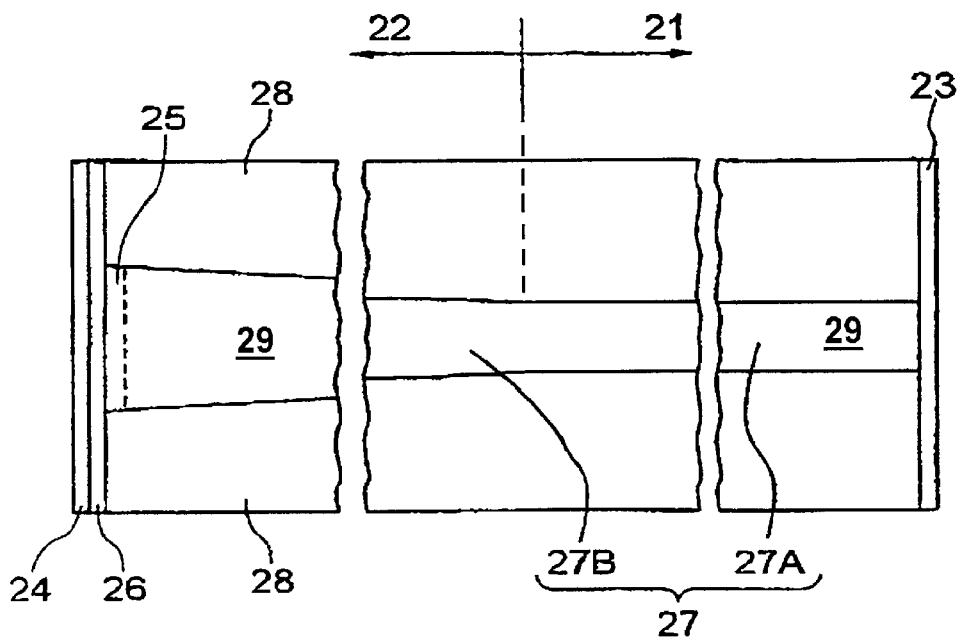
FIG. 3
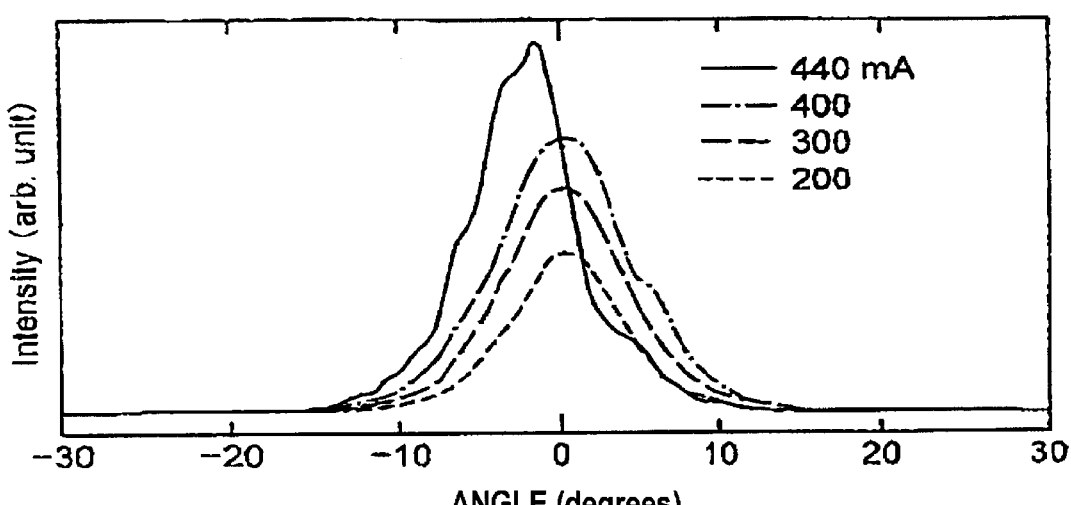
FIG. 4 *(PRIOR ART)*

SEMICONDUCTOR LASER DIODE

FIELD OF THE INVENTION

The present invention relates to semiconductor laser diodes, and is particularly applicable to high power laser diodes with a ridge-type design.

BACKGROUND OF THE INVENTION

In order to respond to demand for semiconductor laser diodes having higher output and effective coupling to an optical fiber, it is necessary to suppress the occurrence of spatial hole-burning which prevents uniform distribution of carriers in the laser.

One method for preventing spatial hole-burning is to increase the width of the active region of the laser diode to lower the optical density at the output facet. However, increasing the width of the active region width is likely to generate emissions at a higher-order modes, destabilizing the emission of laser rays. Thus, there is a trade-off between the suppression of the higher-order mode emission and the spatial hole-burning are in a strict trade-off relation with respect to the active region width.

One method of moderating the trade-off relation is introduction of a flared structure in the active region, which enables the enlargement of the width of the active region at the laser output facet where reduction of the optical density is desirable. Increasing the active region width increases of the surface area of the output facet to secondarily suppress the facet destruction increasing the reliability of the semiconductor laser diode.

However, in the conventional semiconductor laser diode having the flared structure, the stable and continuous emission in the fundamental mode is difficult to attain, and the product yield of the semiconductor laser diode which is able to maintain stable fundamental mode emission is low.

SUMMARY OF THE INVENTION

In one aspect of the present invention, a semiconductor laser diode including: a semiconductor substrate; a resonator structure including a first facet having a reflective coating, a second facet having an antireflective coating, and a propagation direction which extends from the first facet to the second facet; and an active region including a linear section extending from the first facet along the propagation direction of the resonator and having a width "d" which is substantially uniform along the propagation direction, and a flared section extending from the linear section toward the second facet, the flared section having a tapered width increasing toward the second facet, wherein the relation of $d<\lambda_0/\{2\cdot(2\cdot n_0\cdot\Delta n)^{0.5}\}$ holds in which An is a difference between equivalent refractive indexes of the active region and inactive regions extending along both sides of the active region, "d" is a width of the linear section in the active region, "$\lambda_0$" is a laser emission wavelength, and "$n_0$" is an equivalent refractive index of the linear, is provided.

In accordance with the present invention, the semiconductor laser diode can be realized which emits in a stable fundamental mode by satisfying the above relation for increasing the effect for suppressing the spatial hole-burning phenomenon.

The above and other objects, features and advantages of the present invention will be more apparent from the following description.

BRIEF DESCRIPTION OF THE DRAWINGS

FIG. 3 is a schematic view showing the flared structure of the semiconductor laser diode of the preferred embodiment.

FIG. 4 is a graph showing the dependency of the lateral far-field angle on the strength of current in a conventional semiconductor laser diode not having a flared structure.

PREFERRED EMBODIMENTS OF THE INVENTION

The configuration of the semiconductor laser device of an embodiment of the present invention will be described referring to FIGS. 2 and 3.

Figure 2:
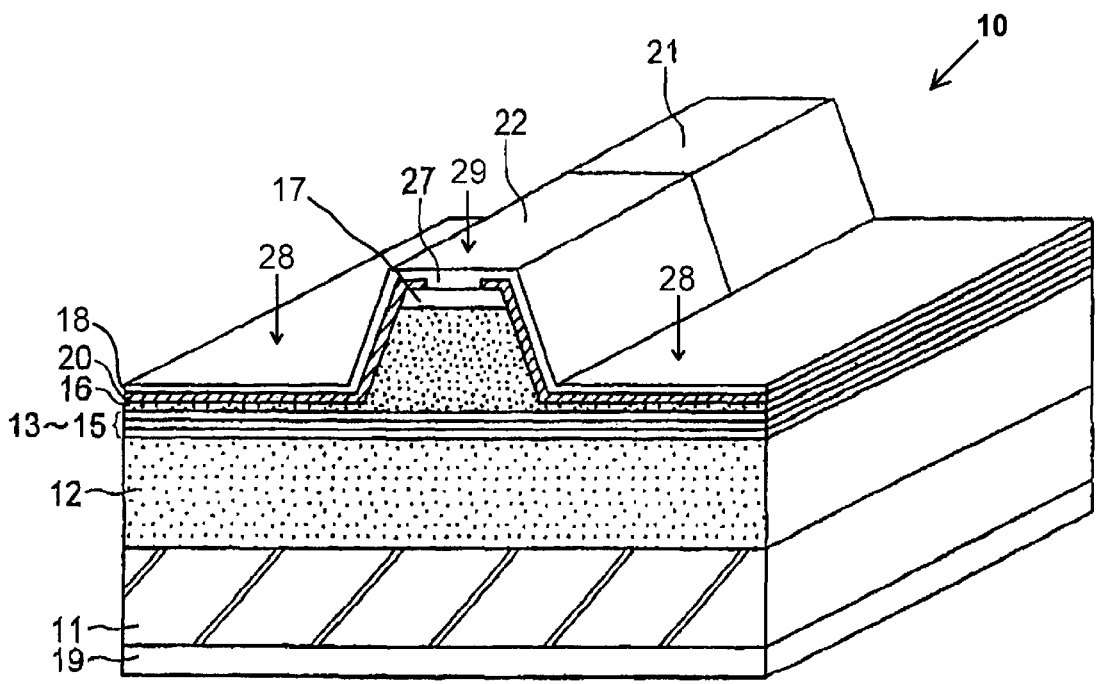
FIG. 2 is a partially cut-away view showing a semiconductor laser diode in accordance with a preferred embodiment of the present invention.

As shown in FIG. 2, an exemplary semiconductor laser device 10 formed as a ridge waveguide comprises a stacked structure having a bottom cladding layer 12 formed from n-AlGaAs, a bottom separate confinement structure (SCH) layer 13 formed from undoped AlGaAs, an active layer 14 comprising a non-lattice-matching multiple quantum well (MQW) structure formed from InGaAs and constructed to emit light of the wavelength of approximately 980 nm, a top SCH layer 15 formed from undoped AlGaAs, a top cladding layer 16 formed from p-AlGaAs and a cap layer 17 formed from p-GaAs, sequentially stacked and overlying an n-GaAs substrate 11. The maximum optical output power of the device is about 500 mW for a cavity length of approximately 1400 μm.

The p-GaAs cap layer 17 and the top section of the top cladding layer 16 form a ridge stripe. This ridge stripe and the portions of layers 12–15 that lie below the ridge provide an active region 29 of the device, within which the laser light is generated. Layers 13–15 collectively form a core layer for the laser diode device. The active region 29 has optical gain in its core layer area, which is the area underlying the ridge stripe. The flat areas on either side of the ridge stripe are generally referred to herein as the inactive regions 28. Each inactive region 28 has no optical gain in its core layer area nor in its residual portion of cladding layer 16.

A protective film 20 comprising a SiN film is formed on the ridge and the flat sections of the top cladding layer 16 except for a window 27 located on the top of the ridge. A p-electrode 18 formed by a stacked metal film of Ti/Pt/Au is formed on the ridge, the ridge sidewall and the flat section of the top cladding layer 16, and an n-electrode 19 formed by a stacked metal film of AuGeNi/Au is formed on the bottom surface of the n-GaAs substrate 11. The p-electrode 18 is connected to the cap layer 17 exposed to the window 27 located on the top of the ridge. Active region 29 includes window 27 and electrode 18, and inactive regions 28 include the overlying portions of SiN film 20 and electrode 18.

As shown in the top view of FIG. 3, the active region 29 of semiconductor laser diode 10 includes a linear section 21 extending from a first facet along the ridge stripe and having a substantially fixed (uniform) width along the length of section 21, and a flared section 22 having a tapered width and continuously connected to the linear section 21, and extending therefrom to a second facet along the ridge. A high reflective (HR) coating 23 is formed on the first facet (linear section 21), and an antireflective (AR) coating 24 is formed on the second facet (flared section 22). The second facet serves at the output facet. As depicted in FIG. 3, the width of the flared section 22 enlarges toward the other facet along the ridge. The location of window 27 is generally depicted in FIG. 3, with reference number 27A indicating the portion of the window that overlies linear section 21, and reference number 27B indicating the portion of the window that overlies flared section 22. The current injection into the linear section 21 is defined by the window 27A of the protective film 20, and the current injection into the flared section is defined by the window 27B of the protective film 20. In this regard, windows 27A and 27B define, or "form," sections 21 and 22. The shapes of windows 27A and 27B substantially conform to the shapes of sections 21 and 22, respectively. However, to form a current non-injection structure 25 (as described more fully below), the end section of window 27B does not fully extend to the left end of active region 29, as indicated by the dashed line near reference number 25.

The protective film 20 formed over inactive regions 28 prevents current from being injected into these regions, and thus makes these regions current blocking regions, and prevents light from being generated therein. In addition, as described below, the presence of protective film 20 in this embodiment slightly changes the effective index of refraction for the core layers in the inactive regions 28.

In one implementation of the ridge embodiment, the lengths of the linear section 21 and the flared section 22 are 800 μm and 600 μm, respectively. The waveguide width of the linear section 21, as measured at the bottom of the ridge stripe, is 4 μm uniformly along the cavity length of section 21, which is the propagation direction of light in the resonator cavity. (This width is substantially equal to the width of the window 27A formed in the protective film 20) The waveguide width of the flared section 22, as measured at the bottom of the ridge stripe, enlarges toward the output facet from 4 μm to 6 μm. (This enlarging width substantially follows the enlarging width of the window 27B formed in the protective film 20) Thereby, the width undergoes a change of $\Delta W = 2$ μm over a distance $L = 600$ μm. We refer to the change of $\Delta W$ over the distance L as a "flare angle," which is defined as $\tan^{-1}(\Delta W/2)/L$. In this case, it is calculated to be about 0.1°. (It should be noted that this relation may be applied to the widths as measured at the top of the ridge stripe, or at any other measurement height of the ridge stripe, as long as the same measurement height is used for the measurements.) In this implementation of the ridge embodiment, the outline of the window 27B of the flared section, or the boundary of the active region with the inactive region 28, is a gentle parabolic line. Other shapes for the line may be used, but in all cases the flare angle is computed in the same way.

Further, an InGaP layer 26 having a thickness of 100 nm is preferably deposited on the inner surface of the AR coating 24, and a non-injected structure 25 having a thickness of 25 μm is formed on the inner surface of the InGaP layer 26. The window 27B of the protective film 20 is not formed in the area where non-injected structure 25 is located in order to create structure 25.

In the semiconductor laser diode of the present invention having the above configuration, the difference between equivalent refractive indexes of the active region 29 (i.e., the ridged mesa) and the inactive region 28 (i.e., the area on either side of the mesa which are covered by the protective film 20) is $2 \times 10^{-3}$. (A brief description on measuring and computing the effective indices of refraction is provided at the end of this specification.) In preferred embodiments of the present invention, this difference between the effective indices of refraction satisfies a relation of $d < \lambda_0 / \{2 \cdot (2 \cdot n_0 \cdot \Delta n)^{0.5}\}$, wherein $\Delta n$ is the difference between the equivalent refractive indexes of the active region and the inactive region extending along the both sides of the active region, "d" is the width of the active region of the linear section of the resonator, "$\lambda_0$" is a laser emission wavelength, and "$n_0$" is an equivalent refractive index of the active region of the linear section. (In the exemplary device shown in FIGS. 2 and 3, the side walls of the ridge stripe are not exactly vertical, and therefore the width as measured at the bottom of the ridge stripe is slightly larger than the width as measured at the top of the ridge stripe. In cases where the side walls are not exactly vertical, we measure the width "d" at the bottom of the ridge structure when evaluating this relation.)

For our example, if the equivalent refractive index "$n_0$" is 3.3, then the quantity $\lambda_0 / \{2 \cdot (2 \cdot n_0 \cdot \Delta n)^{0.5}\}$ is 4.26 μm. In this example, the above relation is satisfied because "d" is substantially equal to 4 μm, as indicated above.

The present inventor has confirmed through experiments that in order to suppress the higher-order mode excitation in the flared section of a laser diode, the difference between refractive indexes of the active region and the inactive regions extending along the both sides of the active region is required to be sufficiently reduced, preferably such that the relation of $d < \lambda_0 / \{2 \cdot (2 \cdot n_0 \cdot \Delta n)^{0.5}\}$ is satisfied, wherein An is the difference between the equivalent refractive indexes of the active region and the inactive region, "d" is the width of the active region in the linear section of the resonator (as measured at the bottom of the ridge stripe), "$\lambda_0$" is the laser emission wavelength, and "$n_0$" is the equivalent refractive index of the linear section.

The above relation is known to relate to so-called cut-off conditions whereby high-order modes are prevented from propagating (high-order modes are those which have higher mode numbers than the fundamental mode). However, the active region of the semiconductor laser possesses optical gain in addition to the inherent refractive index difference, and this gain may be made to be different among the modes. Therefore, even if the cut-off conditions for the high-order modes are not satisfied, the fundamental mode can be easily obtained and the high order modes can be suppressed if the optical gain of the fundamental mode is made to be greater than the optical gains of the high order modes. (As is known in the art, the fundamental mode has a single peak intensity level in a plane which is perpendicular to the propagation direction of the resonator structure.) Thus, in such cases, adherence to the relation $d < \lambda_0 / \{2 \cdot (2 \cdot n_0 \cdot \Delta n)^{0.5}\}$ can be relaxed by a small amount. In such a case, it may be broadly stated that optical gain and width of the linear section of the active region are constructed such that the majority of the emitted light is generated in a fundamental mode (as opposed to the high-order modes).

When the widths of both the linear section and the flared section are not designed to satisfy the cut-off conditions, excitation at higher-order modes becomes prevalent. Based on experimentation, the present inventor has found that the width of the active region of the linear section is required to satisfy the above described cut-off conditions in order to perform the stable fundamental lateral mode emission. However, if there laser is designed to suppress the optical gain of the higher order modes, then the requirement can be relaxed somewhat, as indicated above.

In the present invention, the kind and the composition of a compound semiconductor layer constituting the resonator are not restricted. The flared structure can be easily fabricated in accordance with a known fabrication methods including photolithography and etching. The structure of the waveguide is not restricted, for example the invention has application both to lasers using ridge waveguides and a buried waveguides. Likewise the inactive region is not limited and may include, for example, both current blocking regions and radiation mode suppression regions.

Further, as described below, the present inventor has experimentally found the that certain geometrical configurations of the flared structure produces both excellent performance and good product yield of the inventive semiconductor laser diodes.

For experimental purposes, the inventor fabricated semiconductor laser diodes having flared regions of different geometries and investigated the performance and the product yield of the semiconductor laser diodes. The results are shown in Table 1 wherein the geometry of the laser diodes having a product yield of 50% or more and a product yield below 50% are evaluated to be GOOD and NG, respectively. In particular in this first experiment, the flare angle or "extension rate" of the flare region was investigated, as described below.

Figure 1:
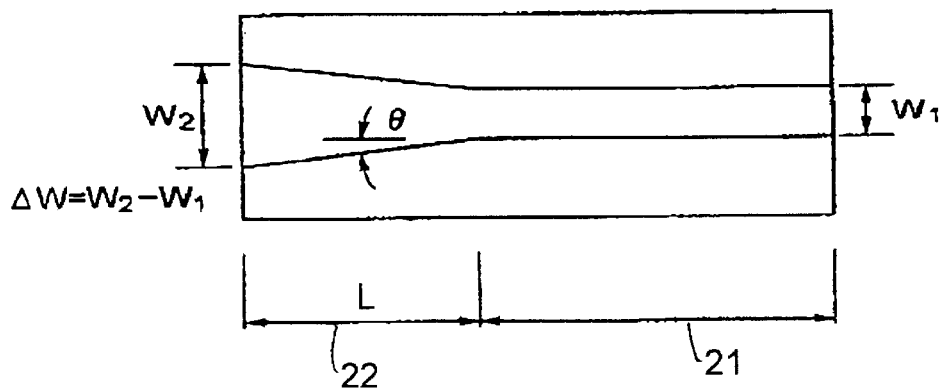
FIG. 1 is a schematic view showing a laser having a flared active region.

In this test, the extension rate of the flared width is defined by using "$\theta$" as shown in FIG. 1, wherein "L" is the length of the flared section 22, $\Delta W$ is a difference ($W_2 - W_1$) between the width ($W_2$) of the flared section 22 at the output facet and the width ($W_1$) of the linear section 21, and "$\theta$" is an angle between the extended line of the boundary of the linear section 21 and the boundary of the flared section 22, such that $\tan \theta = (\theta W/2)/L$.

As shown in Table 1, the product yield is GOOD when $\theta$ or $\tan^{-1} \{(\Delta W/2)/L\}$ is 0.25° or less.

TABLE 1

Dependency of Product Yield On Flared Shape

| $\theta = \tan^{-1} \{(\Delta W/2)/L\}°$ | Product Yield |
|---|---|
| 0.57 | NG |
| 0.34 | NG |
| 0.30 | NG |
| 0.26 | NG |
| 0.24 | GOOD |
| 0.23 | GOOD |
| 0.19 | GOOD |
| 0.01 | GOOD |

Based on these findings, $\Delta W$ and "L" of the preferred embodiment of the present invention should satisfy the relation $\tan^{-1} (\Delta W/2)/L\} < 0.25°$.

Figure 6A:
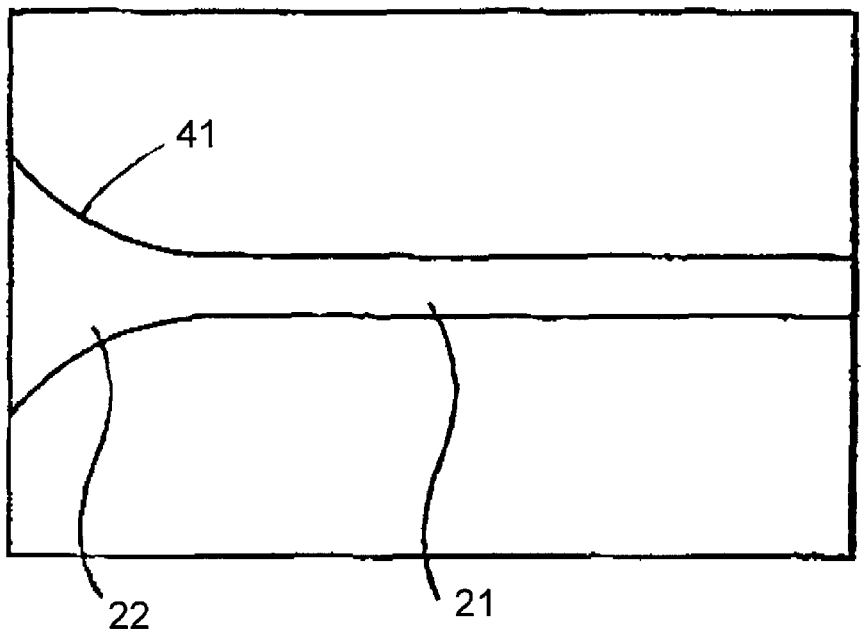
FIGS. 6A and 6B are schematic views showing the different configurations for flared active regions in a laser diode in accordance with the present invention.
Figure 6B:
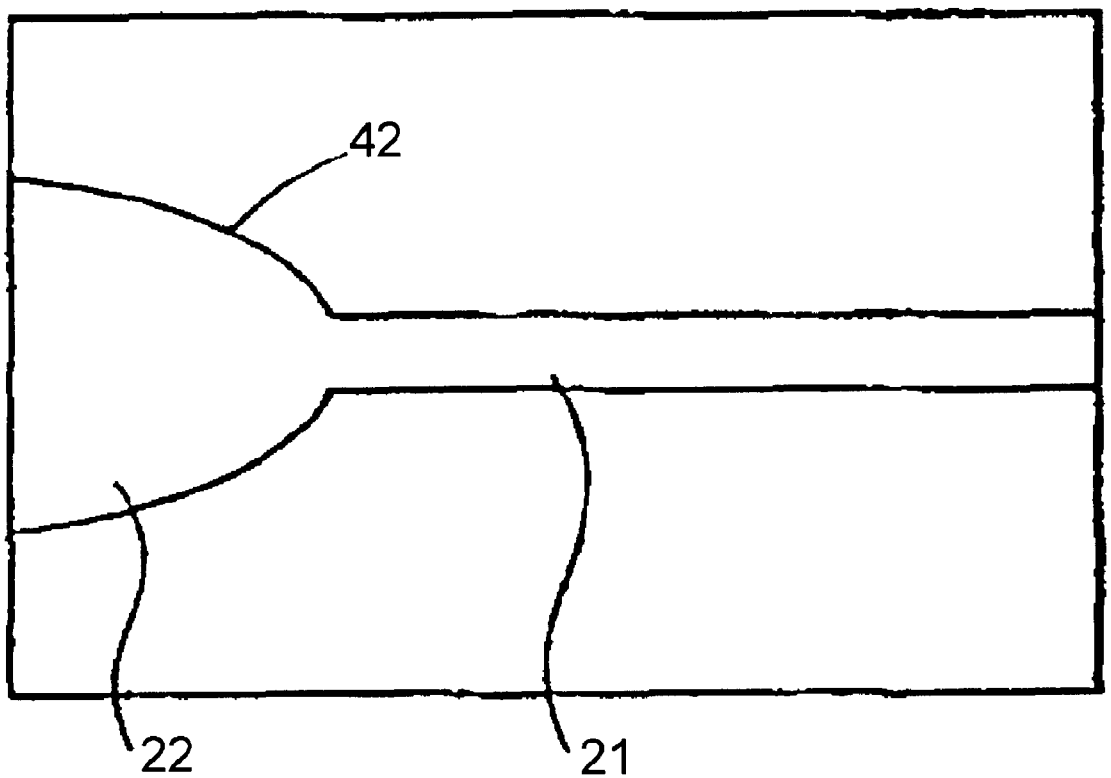

The shape of the active region 27 of the semiconductor laser diode is not restricted to that shown in FIG. 3. As shown in FIGS. 6A and 6B, an active region having a boundary with an inactive region specified by an exponential curve 41 (FIG. 6A) and another active region having a boundary with an inactive region specified by a parabola curve 42 (FIG. 6B) may be used. So long as the width of the active region of the flared section (window width) or the spacing between the both boundaries extending along the active region and the adjacent inactive regions enlarges toward the output facet, the boundary can be freely established.

In a further embodiment of the present invention, the boundary between the active region and the inactive region defining the flared portion may be curved rather than linear. For purposes of the invention, "$\theta$", in case of the curve, is the angle defined by $\tan^{-1} \{(\Delta W/2)/L\}$.

The present inventor fabricated prototype three semiconductor laser diodes having the flared section length which was 30% of the entire cavity length. The respective three semiconductor laser diodes included the boundaries having a convex exponential shape, a concave parabolic shape and a linear tapered shape. The terms "concave" and "convex" are defined as being relative to the center longitudinal axis of the laser. The dependency of the fundamental mode rate of the product yield on the flared structure was investigated, and the product yields are shown in Table 2.

TABLE 2

Dependency of Product, Yield on Flared Structure

| | Geometry of Flared Shape | | |
|---|---|---|---|
| | Convex Exponential | Concave Parabolic | Linear Tapered |
| Fundamental mode | 65% | 85% | 70% |

As is apparent from Table 2, the concave parabolic flared shape provided the fundamental mode semiconductor laser diode with the highest yield. Accordingly, the most suitable boundary of the flared section between the active region and the inactive region has a concave boundary which preferably approximates a parabolic line.

In a further aspect of the present invention, it was discovered that lasers having the flared structure of the present invention had significantly less facet destruction when the current non-injected region 25 (structure 25) (shown in FIG. 3) was mounted inside of the facet of the flared section side or the output facet. The effect was so significant that the degree thereof could be explained only by the synergistic effect with the flared structure.

Accordingly, in a preferred embodiment of the present invention, a current non-injected region 25 (FIG. 3) having a thickness between 10 and 100 $\mu$m is inwardly mounted on the output facet. It has further been determined that there is little benefit when the thickness is below 10 $\mu$m or greater than 100 $\mu$m.

Further, when a compound semiconductor layer 26 (shown in FIG. 3) different from that constituting the resonator structure was mounted on the inner surface of the output facet the effect of suppressing the facet destruction resulted in a remarkable elevation in the reliability of the semiconductor laser diode. Accordingly, in the preferred embodiment of the present invention, a compound semiconductor layer 26 different from that constituting the resonator structure is mounted on the facet of the flared section.

The evaluation of the suppression of the spatial hole-burning by the flared structure can be confirmed by the behavior of the far-field-pattern (FFP) of the lateral direction or the analysis of the relation between the injected current and the optical strength.

Figure 5:
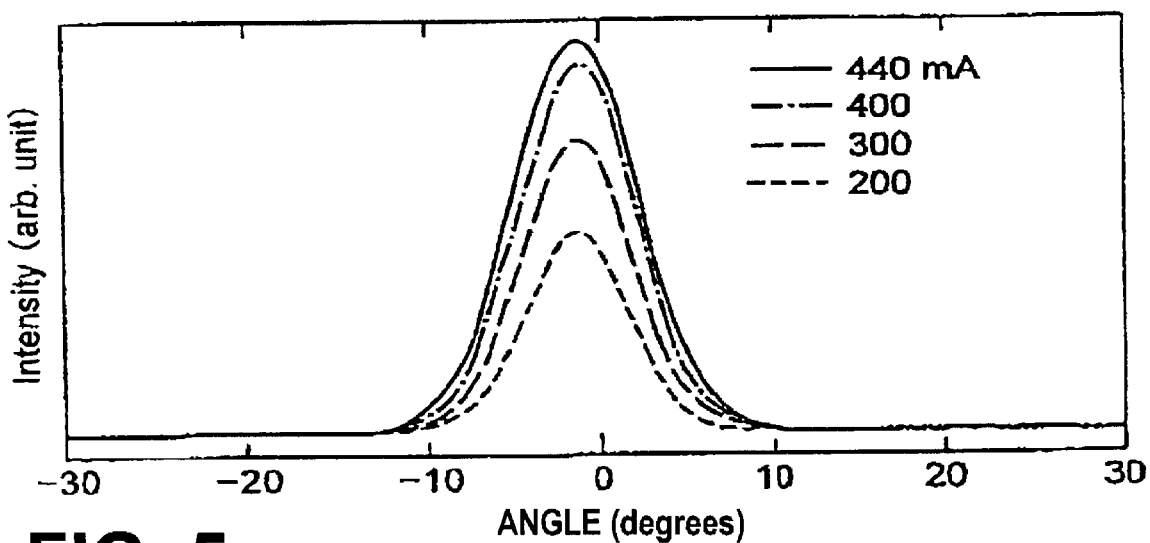
FIG. 5 is a graph showing the dependency of the lateral far-field angle on the strength of current in the semiconductor laser diode of the preferred embodiment.

The semiconductor laser diode of the embodiment apparently exhibits a fundamental mode stability, stronger than that of the conventional semiconductor laser diode, in a lateral direction in the FFP up to the higher injected current value judged from the comparison between graphs of FIGS. 4 and 5 which show current dependencies of the FFP in the lateral direction of the conventional semiconductor laser diode having no flared structure and the semiconductor laser diode having similar configurations to those of the present invention, respectively. Furthermore, the center of the fundamental mode of the embodiment does not move.

In the graphs of FIGS. 4 and 5, the abscissas indicate a far-field angle and the ordinates indicate optical strength distribution using the injected current values as a parameter.

These results are realized because the optical density at the output facet is reduced thereby suppressing spatial hole-burning. Although the optical output is increased, the intensity is reduced by the flared structure having a wider waveguide.

A first prototype semiconductor laser diode including a linear section having a length of 0.8 mm was fabricated for evaluation of the suppression of the spatial hole-burning by the flared structure.

The prototype semiconductor laser diode of the present invention exhibited an resulted in suppression of spatial hole-burning regardless of the length of the linear section. A second prototype semiconductor laser diode was then fabricated in substantially same the same manner as the first semiconductor laser diode, but having a length of 1.2 mm. The evaluation of the suppression of the spatial hole-burning was conducted and the results were substantially same as those for the first prototype semiconductor laser diode.

Description of Computing Effective Indices of Refraction.

We generally define the effective index of refraction $n_{eff}$ of a given region (either active region or inactive region) as being equal to the ratio of the speed of light "c" in free space to the speed of light "$\upsilon_{core}$" in the core layer of the given region: $n_{eff}=c/\upsilon_{core}$. Because the light beam penetrates about 500 to 600 nm into the cladding layers which are on either side of the core layer, $\upsilon_{core}$ is dependent upon the material properties of the cladding layers as well as the core layers. In the ridge embodiment presented above, the inactive region differs from the active region by having a different structure in the upper cladding layer: the upper cladding layer of the inactive region comprises combination of a thin portion of layer 16 and all of layer 20, whereas the upper cladding layer of the active region comprises a thicker portion of layer 16 (layer 17 usually has no impact since it is usually sufficiently far from the penetration depth of the light). Because the dielectric constants and bulk refractive indices of layers 16 and 20 are very different, the effective indices of refraction for the inactive region and active region will be different. The Effective Indices of Refraction used herein may be measured experimentally or computed according to the approaches described in the following exemplary references:

1. Ramo, Whinnery, & Van Duzer, "Fields and Waves in Communication Electronics," second edition, John Wiley & Sons publishers, 1984, pages 752–756.

2. Coldren & Corzine, "Diode Lasers and Photonic Integrated Circuits," John Wiley & Sons publishers, 1995, pages 428–432.

As a brief summary to these methods, a parallel-plane guide (infinite extent in the y-direction; the y-direction being parallel to the active layers and perpendicular to the direction of light propagation) is assumed for the region, which can be the active region or the inactive region. A fundamental TE-mode which propagate in the Z-direction is also assumed for the light. A mathematical form of the Y-direction electric field Ey is proposed for the core layer and each of the cladding layers. The top cladding layer may comprise two or more sub-layers of different materials, in which case a separate form of Ey is proposed for each sub-layer. The forms of Ey are jointly solved to satisfy Maxwell's equations with a common propagation constant. An effective index of refraction is thereafter computed from the common propagation constant by a straightforward means.

Since the above embodiment is described only for examples, the present invention is not limited to the above embodiment and various modifications or alterations can be easily made therefrom by those skilled present invention:

This invention is useful for pumping laser of the wavelength of not only 980 nm but also 1480 nm. And this invention is useful for pumping laser of not only ridge structure but also BH (Buried Heterostructure).

What is claimed is:

1. A semiconductor laser device comprising:
a semiconductor substrate;
a resonator structure including a first facet having a reflective coating, a second facet having an antireflective coating, and a propagation direction which extends from the first facet to the second facet; and
an active region configured to generate light and including a linear section extending from the first facet along the propagation direction of the resonator structure and having a width "d" which is substantially uniform along the propagation direction, and a flared section extending from the linear section toward the second facet, the flared section having a tapered width increasing toward the second facet,
wherein the relation of $\tan^{-1}\{(\Delta W/2)/L\}<0.25°$ holds, in which "L" is a length of the flared section in the propagation direction of the resonator structure, and $\Delta W$ is a difference between a width ($W_2$) of the flared section at the second facet and a width ($W_1$) of the linear section.

2. The semiconductor laser device as defined in claim 1, wherein the length L is greater than the quantity $[1\ \mu m]/[\tan(0.25°)]$.

3. The semiconductor laser device as defined in claim 1, wherein a boundary between the active region and the inactive region forms a concave line.

4. The semiconductor laser device as defined in claim 1, wherein a current non-injected region having a thickness between 10 and 100 $\mu m$ is inwardly formed on the second facet.

5. The semiconductor laser device as defined in claim 1, wherein a compound semiconductor layer different from a compound semiconductor layer of the resonator structure is formed on the second facet.

6. The semiconductor laser device as defined in claim 1, wherein the wavelength $\lambda_0$ is in a range from 900 nm to 1100 nm.

7. The semiconductor laser device as defined in claim 1, wherein the resonator structure comprises a ridge stripe.

8. The semiconductor laser device as defined in claim 1, wherein the output power is 300 mW or more.

9. The semiconductor laser device as defined in claim 1, wherein the resonator structure comprises a ridge of semiconductor material which is disposed on the semiconductor substrate, is located between the first and second facets, and is oriented along the propagation direction of the resonator structure;
wherein the active region includes the ridge of semiconductor material and at least a portion of the semiconductor substrate which underlines the semiconductor ridge; and
wherein the width "d" is measured at the bottom of the semiconductor ridge where it joins the semiconductor substrate.

10. A semiconductor laser device comprising:
a semiconductor substrate;
a resonator structure including a first facet having a reflective coating, a second facet having an antireflective coating, and a propagation direction which extends from the first facet to the second facet; and an active region configured to generate light and including a linear section extending from the first facet along the propagation direction of the resonator structure and having a width which is substantially uniform along the propagation direction, and a flared section extending from the linear section toward the second facet, the flared section having a tapered width increasing toward the second facet;

wherein the linear section of the active region is constructed such that the majority of the emitted light is generated in a fundamental mode, the fundamental mode having a single peak intensity level in a plane which is perpendicular to the propagation direction of the resonator structure; and wherein the relation of $\tan^{-1}\{(\Delta W/2)/L\} < 0.25°$ holds, where "L" is a length of the flared section in the propagation direction of the resonator structure, and $\Delta W$ is a difference between a width ($W_2$) of the flared section at the second facet and a width ($W_1$) of the linear section.

11. The semiconductor laser device as defined in claim 10, wherein the relation of $d < \lambda_0/\{2 \cdot (2 \cdot n_0 \cdot \Delta n)^{0.5}\}$ holds, in which $\Delta n$ is a difference between equivalent refractive indexes of the active region and inactive regions extending along both sides of the active region, "$\lambda_0$" is a laser emission wavelength, "d" is the width of the linear section in the active region, and "$n_0$" is an equivalent refractive index of the linear section.

12. The semiconductor laser device as defined in claim 10, wherein a boundary between the active region and the inactive region forms a concave line.

13. The semiconductor laser device as defined in claim 10, wherein a current non-injected region having a thickness between 10 μm and 100 μm is inwardly formed on the second facet.

14. The semiconductor laser device as defined in claim 10, wherein a compound semiconductor layer different from a compound semiconductor layer of the resonator structure is formed on the output facet.

15. The semiconductor laser device as defined in claim 10, wherein the wavelength $\lambda_0$ is in a range from 900 nm to 1100 nm.

16. The semiconductor laser device as defined in claim 10, wherein the resonator structure comprises a ridge stripe.

17. The semiconductor laser device as defined in claim 10, wherein the output power is 300 mW or more.

18. The semiconductor laser device as defined in claim 11, wherein the resonator structure comprises a ridge of semiconductor material which is disposed on the semiconductor substrate, is located between the first and second facets, and is oriented along the propagation direction of the resonator structure;

wherein the active region includes the ridge of semiconductor material and at least a portion of the semiconductor substrate which underlines the semiconductor ridge; and wherein the width "d" is measured at the bottom of the semiconductor ridge where it joins the semiconductor substrate.

19. The semiconductor laser device as defined in claim 10, wherein the length L is greater than the quantity [1 μm]/[tan(0.25°)].

20. The semiconductor laser device as defined in claim 10, wherein the substrate comprises GaAs, and wherein the semiconductor laser device further comprises a lower cladding layer disposed between the substrate and the active region, the lower cladding layer comprising AlGaAs.

21. The semiconductor laser device as defined in claim 1, wherein the relation of $d < \lambda_0/\{2 \cdot (2 \cdot n_0 \cdot \Delta n)^{0.5}\}$ holds, in which $\Delta n$ is a difference between equivalent refractive indexes of the active region and inactive regions extending along both sides of the active region, "$\lambda_0$" is a laser emission wavelength, and "$n_0$" is an equivalent refractive index of the linear section.

22. The semiconductor laser device as defined in claim 1, wherein the substrate comprises GaAs, and wherein the semiconductor laser device further comprises a lower cladding layer disposed between the substrate and the active region, the lower cladding layer comprising AlGaAs.

* * * * *